(12) United States Patent
Enomoto et al.

(10) Patent No.: US 7,795,369 B2
(45) Date of Patent: Sep. 14, 2010

(54) SULFUR ATOM-CONTAINING ANTI-REFLECTIVE COATING FORMING COMPOSITION FOR LITHOGRAPHY

(75) Inventors: Tomoyuki Enomoto, Toyama (JP); Yoshiomi Hiroi, Toyama (JP); Keisuke Nakayama, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 32 days.

(21) Appl. No.: 11/664,989

(22) PCT Filed: Sep. 27, 2005

(86) PCT No.: PCT/JP2005/017733

§ 371 (c)(1), (2), (4) Date: Apr. 10, 2007

(87) PCT Pub. No.: WO2006/040921

PCT Pub. Date: Apr. 20, 2006

(65) Prior Publication Data

US 2008/0118870 A1 May 22, 2008

(30) Foreign Application Priority Data

Oct. 12, 2004 (JP) .............................. 2004-297640

(51) Int. Cl.
*C08G 12/32* (2006.01)
*C08G 12/12* (2006.01)

(52) U.S. Cl. .................... 528/265; 528/390; 430/271.1; 430/311

(58) Field of Classification Search ................ None
See application file for complete search history.

(56) References Cited

U.S. PATENT DOCUMENTS

| 3,300,336 | A | | 1/1967 | Gagliardi et al. |
| 3,310,420 | A | * | 3/1967 | Wagner ....................... 427/341 |
| 3,317,345 | A | | 5/1967 | Fluck, Jr. et al. |
| 4,562,116 | A | * | 12/1985 | Okada et al. ........... 428/402.21 |
| 5,693,691 | A | | 12/1997 | Flaim et al. |
| 5,919,599 | A | | 7/1999 | Meador et al. |
| 6,323,310 | B1 | | 11/2001 | Puligadda et al. |
| 2004/0110096 | A1 | | 6/2004 | Kishioka et al. |

FOREIGN PATENT DOCUMENTS

| AU | 34888 71 A | 5/1973 |
| JP | A 60-220931 | 11/1985 |
| JP | A-63-309681 | 12/1988 |
| JP | A 2004-123817 | 4/2004 |
| WO | WO 02/086624 A1 | 10/2002 |
| WO | WO 2004/034148 A1 | 4/2004 |
| WO | WO 2005/088398 A1 | 9/2005 |

OTHER PUBLICATIONS

Schmaljohann et al., "Design Strategies for 157 nm Single-Layer Photoresists: Lithographic Evaluation of a Poly(α-trifluoromethyl vinyl alcohol) Copolymer." Proceedings of SPIE: *Advances in Resist Technology and Processing XVII*, vol. 3999, Part 1 of 2, 2000, p. 330-334, Jun. 2000.

Crawford et al., "New Materials for 157 nm Photoresists: Characterization and Properties." Proceedings of SPIE: *Advances in Resist Technology and Processing XVII*, vol. 3999, Part 1 of 2, 2000, p. 357-364, Jun. 2000.

Patterson et al., "Polymers for 157 nm Photoresist Applications: A Progress Report." Proceedings of SPIE: *Advances in Resist Technology and Processing XVII*, vol. 3999, Part 1 of 2, 2000, p. 365-374, Jun. 2000.

Trumbo, D.L., "Synthesis of polymers from 1,3-bishydroxymethyl-2-imidazolidone," Polymer Bulletin, vol. 24, No. 4, pp. 379-384, Oct. 1990.

May 11, 2010 European Search Repon issued in Application No. 05788389.4.

\* cited by examiner

*Primary Examiner*—Daborah Chacko Davis
(74) *Attorney, Agent, or Firm*—Oliff & Berridge, PLC

(57) ABSTRACT

There is provided an anti-reflective coating forming composition for lithography comprising a reaction product obtained by reacting a sulfur-containing compound having thiourea structure with a nitrogen-containing compound having two or more nitrogen atoms substituted with a hydroxymethyl group or an alkoxymethyl group in the presence of an acid catalyst and a solvent. The anti-reflective coating obtained from the composition has a high preventive effect for reflected light, causes no intermixing with photoresists, has a higher dry etching rate compared with photoresists and can use in lithography process for manufacturing semiconductor device.

4 Claims, No Drawings

SULFUR ATOM-CONTAINING ANTI-REFLECTIVE COATING FORMING COMPOSITION FOR LITHOGRAPHY

TECHNICAL FIELD

The present invention relates to an anti-reflective coating forming composition for lithography that is used in lithography process for manufacturing a semiconductor device. Specifically, the present invention relates to an anti-reflective coating forming composition for lithography for forming an anti-reflective coating applied under a photoresist, which is used for reducing reflection of irradiation light for exposing from a semiconductor substrate. Further, the present invention relates to a method for forming photoresist pattern by use of the anti-reflective coating forming composition.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for the device is depicted, developing it to obtain a photoresist pattern, and etching the substrate using the photoresist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, reflection of exposure light from a substrate have become problems. Accordingly, it has been widely studied to provide an anti-reflective coating (bottom anti-reflective coating) between the photoresist and the substrate.

As the anti-reflective coatings, inorganic anti-reflective coatings made of titanium dioxide, and titanium nitride, etc. and organic anti-reflective coatings made of a light absorbing substance and a polymer compound are known. The former requires an installation such as a vacuum deposition apparatus, a CVD apparatus or a sputtering apparatus, etc. In contrast, the latter is considered advantageous in that it requires no special installation so that many studies have been made. For example, mention may be made of the acrylic resin type anti-reflective coating having a hydroxyl group being a crosslink-forming substituent and a light absorbing group in the same molecule as disclosed in U.S. Pat. No. 5,919,599 and the novolak resin type anti-reflective coating having a hydroxyl group being a crosslink-forming substituent and a light absorbing group in the same molecule as disclosed in U.S. Pat. No. 5,693,691.

The physical properties desired for organic anti-reflective coating include high absorbance to light used for exposure, no intermixing with photoresists (being insoluble in photoresist solvents), no diffusion of low molecular weight compounds from the anti-reflective coating material into the topcoat photoresist, and a higher dry etching rate than the photoresist.

In recent years, miniaturization of process size in a lithography process by use of KrF excimer laser beam or ArF excimer laser beam, that is, miniaturization of formed photoresist pattern size is advanced. In order to prevent collapse or the like of photoresist pattern that is accompanied with miniaturization of photoresist pattern, it is desired to make the photoresist thinner. In addition, when the photoresist is used in a form of thin film, in order to inhibit decrease in film thickness of photoresist layer in the process of removing anti-reflective coating used together by etching, it is desired that the anti-reflective coating can be removed by etching for a shorter time. That is, in order to make the time required for an etching removing step shorter, there are demands for anti-reflective coatings that can be used in a form of thinner film compared with the conventional ones, or for anti-reflective coatings having a higher selection ratio of etching rate to photoresists compared with the conventional one.

It is also requested for the anti-reflective coatings to be able to form a photoresist pattern having a good shape. In particular, it is required to be able to form a photoresist pattern having no footing at the lower part. This is because the photoresist pattern having footing exerts adverse effects on the following processing steps.

In addition, the kinds of photoresists used increase with the progress of lithography technique. Therefore, it is always desired to develop novel anti-reflective coatings in order to adapt to the use of the diverse photoresists.

As an example of such a novel anti-reflective coating, a coating forming composition containing a thiocarbamoyl compound as a light absorbing agent is known (see, for example Patent Document 1). In addition, a base material for a photosensitive resin containing a condensation product of formalin-modified melamine derivative is known (see, for example Patent Document 2). Further, a composition for an anti-reflective coating containing a polymerized aminoplast is known (see, for example Patent Document 3).

Patent Document 1: JP-A-2004-123817 (2004)
Patent Document 2: JP-A-60-220931 (1985)
Patent Document 3: US-B-6323310 (2001)

DISCLOSURE OF INVENTION

Problem to be Solved by the Invention

An object of the present invention is to provide an anti-reflective coating composition that can be used in lithography process for manufacturing a semiconductor device by use of KrF excimer laser beam (wavelength 248 nm), ArF excimer laser beam (wavelength 193 nm) or F2 excimer laser beam (wavelength 157 nm).

Another object of the present invention is to provide an anti-reflective coating that effectively absorbs light reflected from a substrate, causes no intermixing with a photoresist layer and has a higher dry etching rate compared with a photoresist, when KrF excimer laser beam, ArF excimer laser beam or F2 excimer laser beam is used for fine processing, and to provide an anti-reflective coating forming composition for forming the anti-reflective coating. Further, an object of the present invention is also to provide a method for forming an anti-reflective coating for lithography and a method for forming a photoresist pattern, by use of the anti-reflective coating forming composition.

Means for Solving the Problem

As a first aspect, the present invention relates to an anti-reflective coating forming composition for lithography characterized by comprising a reaction product obtained by reacting a sulfur-containing compound having as a partial structure a structure of formula (1):

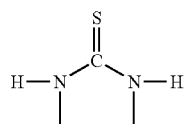

with a nitrogen-containing compound having two or more nitrogen atoms substituted with hydroxymethyl or alkoxymethyl in the presence of an acid catalyst; and a solvent.

As a second aspect, the present invention relates to the anti-reflective coating forming composition for lithography as described in the first aspect, wherein the sulfur-containing compound is a compound of formula (2):

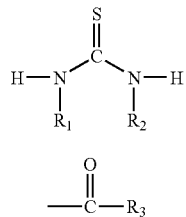

wherein $R_1$ is hydrogen atom or $C_{1-10}$alkyl, $R_2$ is hydrogen atom, $C_{1-10}$alkyl or a group of formula (3) in which $R_3$ is $C_{1-10}$alkyl, phenyl, naphthyl or anthryl, the phenyl, naphthyl and anthryl may be substituted with a group selected from the group consisting of $C_{1-6}$ alkyl, halogen atom, $C_{1-6}$alkoxy, cyano and nitro.

As a third aspect, the present invention relates to the anti-reflective coating forming composition for lithography as described in the first aspect, wherein the sulfur containing compound is a cyclic compound having the structure of formula (1) as a part of the cyclic structure.

As a fourth aspect, the present invention relates to the anti-reflective coating forming composition for lithography as described in the first aspect, wherein the sulfur-containing compound is a compound selected from the group consisting of thiourea, alkyl thiourea having $C_{1-10}$alkyl, acetylthiourea, benzoylthiourea, ethylene thiourea, thiocyanuric acid, and dithiouracil.

As a fifth aspect, the present invention relates to the anti-reflective coating forming composition for lithography as described in the first aspect, wherein the nitrogen-containing compound is a compound of formula (4):

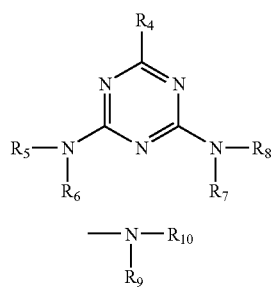

wherein $R_5$, $R_6$, $R_7$ and $R_8$ independently of one another are hydroxymethyl or alkoxymethyl, $R_4$ is phenyl or a group of formula (5) in which $R_9$ and $R_{10}$ independently of each other are hydroxymethyl or alkoxymethyl.

As a sixth aspect, the present invention relates to the anti-reflective coating forming composition for lithography as described in the first aspect, wherein the acid catalyst is an aromatic sulfonic acid compound.

As a seventh aspect, a method for forming photoresist pattern for use in manufacture of semiconductor device, comprising the steps of:
coating the anti-reflective coating forming composition as described in any one of the first to sixth aspects on a semiconductor substrate, and baking it to form an anti-reflective coating,
forming a photoresist layer on the anti-reflective coating,
exposing the semiconductor substrate covered with the anti-reflective coating and the photoresist layer to light, and
developing the photoresist layer after the exposure to light.

EFFECT OF THE INVENTION

The anti-reflective coating forming composition according to the present invention is a composition for forming an anti-reflective coating having a strong absorption to a light having a short wavelength, particularly KrF excimer laser beam (wavelength 248 nm), ArF excimer laser beam (wavelength 193 nm) or F2 excimer laser beam (wavelength 157 nm). The anti-reflective coating obtained therefrom effectively absorbs a light reflected from a substrate.

That is, the present invention can provide an anti-reflective coating that effectively absorbs a light reflected from a semiconductor substrate in fine processing by use of KrF excimer laser beam and ArF excimer laser beam or the like, and that causes no intermixing with a photoresist layer.

The present invention can provide an anti-reflective coating having a high etching rate compared with photoresists.

Further, the use of the anti-reflective coating of the present invention makes possible to form a photoresist pattern having a good shape in lithography process by use of KrF excimer laser beam and ArF excimer laser beam or the like.

BEST MODE FOR CARRYING OUT THE INVENTION

The anti-reflective coating forming composition for lithography according to the present invention comprises a reaction product obtained by reacting a sulfur-containing compound having as a partial structure the structure of the formula (1) with a nitrogen-containing compound having two or more nitrogen atoms substituted with a hydroxymethyl group or an alkoxymethyl group in the presence of an acid catalyst; and a solvent. In addition, the anti-reflective coating forming composition for lithography according to the present invention can comprise a polymer compound, a surfactant and a photoacid generator or the like other than the above-mentioned compounds. And, the proportion of solid content in the anti-reflective coating forming composition is not specifically limited so long as each component homogeneously dissolves in the solvent, for example it is 0.5 to 50 mass %, or 1 to 30 mass %, or 3 to 25 mass %, or 5 to 15 mass %. In this specification, the solid content means all components of the anti-reflective coating forming composition for lithography from which the solvent component is excluded.

The sulfur-containing compound can be used without specific limitation so long as it is a compound having the structure of the formula (1) as a partial structure. The sulfur-containing compound is for example thiourea and the derivative thereof, or a cyclic compound having the structure of the formula (1) as a part of the cyclic structure, such as dithiouracil, and so on.

In particular, as the sulfur-containing compound, the compounds of the formula (2) can be used. In the formula (2), $R_1$ is hydrogen atom or $C_{1-10}$alkyl, $R_2$ is hydrogen atom, $C_{1-10}$alkyl or a group of formula (3). And, in the formula (3), $R_3$ is $C_{1-10}$alkyl, phenyl, naphthyl or anthryl, the phenyl, naphthyl and anthryl may be substituted with a group selected from the group consisting of $C_{1-6}$alkyl, halogen atom, $C_{1-6}$alkoxy, cyano and nitro. The alkyl is for example methyl, ethyl, isopropyl, cyclopentyl, n-hexyl, cyclooctyl, and 2-ethyl-1-hexyl, and so on. The alkoxy is for example methoxy, ethoxy, isopropoxy, cyclohexyloxy, and n-pentyloxy, and so on.

The specific examples of the compounds of the formula (2) are thiourea, methyl thiourea, 1,3-dimethylthiourea, 1,1-dimethylthiourea, ethylthiourea, acetylthiourea, benzoylthiourea, 1-naphthylthiourea, 1-(2-chlorophenyl) thiourea, 1,3-di-n-butylthiourea, 1,3-diphenylthiourea, 1-tert-butyl-3-phenylthiourea, and 1,3-diphenyl- 2-thiourea, and so on.

As the sulfur-containing compound, cyclic compounds having the structure of the formula (1) as a part of the cyclic structure can be used. The cyclic compounds are for example dithiouracil, thiocyanuric acid, ethylene thiourea, 2-thiobarbituric acid, 2-thiouracil, and 5,5-dimethyl-2,4-dithlohydantoin, and so on.

As the nitrogen-containing compound for the reaction product in the anti-reflective coating forming composition for lithography according to the present invention, a nitrogen-containing compound having two or more, for example 2 to 6, or 4 to 6 nitrogen atoms substituted with a hydroxymethyl or an alkoxymethyl can be used. The alkoxymethyl is for example methoxymethyl, ethoxymethyl, isopropoxymethyl, n-butoxymethyl and cyclohexyloxymethyl, and so on.

The nitrogen-containing compound can be obtained by reacting a compound having 2 or more N—H structures, such as urea, melamine, benzoguanamine, and glycolurea, etc., and a polymer compound having as a repeated structural unit a structure containing amide group, such as acrylamide and methacrylamide, etc., with formalin in a boiling water to subject the nitrogen atom to hydroxymethylation and to obtain a compound having two or more hydroxymethyl groups. In this reaction, a basic catalyst such as sodium hydroxide, potassium hydroxide, and tetramethyl ammonium hydroxide, etc. can be used. In addition, alkoxyalkylation of the hydroxymethylated compound with alcohol such as methanol, ethanol, isopropanol, and n-hexanol, etc. can provide a compound having alkoxymethyl group. In the reaction with alcohol, an acid catalyst such as hydrochloric acid, sulfuric acid, and methane sulfonic acid, etc. can be used.

Further, as the nitrogen-containing compound, the compound of the formula (4) can be used. In the formula (4), $R_5$, $R_6$, $R_7$ and $R_8$ independently of one another are hydroxymethyl or alkoxymethyl, $R_4$ is phenyl or a group of formula (5). In the formula (5), $R_9$ and $R_{10}$ independently of each other are hydroxymethyl or alkoxymethyl. The alkoxymethyl is for example methoxymethyl, ethoxymethyl, isopropoxymethyl, n-butoxymethyl and cyclohexyloxymethyl, and so on.

The specific examples of the nitrogen-containing compound in the anti-reflective coating forming composition for lithography according to the present invention are compounds such as hexamethoxy methyl melamine, hexabutoxy methyl melamine, tetramethoxymethyl benzoguanamine, 1,3,4,6-tetrakis(butoxymethyl) glycoluril, 1,3,4,6-tetrakis (hydroxymethyl) glycoluril, 1,3-bis(hydroxymethyl) urea, 1,1,3,3-tetrakis(butoxymethy) urea, 1,1,3,3-tetrakis(methoxymethyl) urea, 1,3-bis(hydroxymethyl)-4,5-dihydroxy-2-imidazolidinone, and 1,3-bis(methoxymethyl)-4,5-dimethoxy-2-imidazolidinone, etc.

The nitrogen-ccontaining compounds are also commercially available compounds such as methoxymethyl type melamine compounds manufactured by Nihon Cytec Industries Inc. (former Mitsui Cytec Co., Ltd.) (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (high condensation type, trade name: Beckamine J-300S, Beckamine P-955, Beckamine N) and the like.

In addition, as the nitrogen-containing compounds, a polymerized compound obtained by reacting the compounds of the formula (4) can be used. For example, such a compound includes polymerized compounds prepared from triazine compounds (trade name Cymel 303 and Cymel 1123, etc.), and they are described in U.S. Pat. No. 6,323,310.

The reaction product contained in the anti-reflective coating forming composition for lithography according to the present invention can be obtained by reacting a sulfur-containing compound having as a partial structure a structure of the formula (1) with a nitrogen-containing compound having two or more nitrogen atoms substituted with a hydroxymethyl group or an alkoxymethyl group in the presence of an acid catalyst. In this reaction, organic acid compounds such as sulfonic acid compounds and carboxylic acid compounds, etc., or inorganic acid compounds such as hydrochloric acid, sulfuric acid and nitric acid, etc., can be used as an acid catalyst.

The carboxylic acid compounds includes acetic acid, benzoic acid, salicylic acid, naphthalene carboxylic acid, and butanoic acid, etc.

The sulfonic acid compounds includes aliphatic sulfonic acid compounds such as methane sulfonic acid, trifluoromethane sulfonic acid, perfluorobutane sulfonic acid, and camphor sulfonic acid, etc. The sulfonic acid compounds also include aromatic sulfonic compounds such as p-toluene sulfonic acid, sulfosalicylic acid acid, pyridinium-p-toluene sulfonic acid, 4-chlorobenzene sulfonic acid, 4-hydroxybenzene sulfonic acid, benzene disulfonic acid, 1-naphthalene sulfonic acid, and pyridinium-1-naphthalene sulfonic acid, etc.

The acid catalyst is used in a proportion of for example 0.1 to 10 mass parts, or 0.5 to 5 mass parts, or 1 to 3 mass parts based on 100 mass parts of the sulfur-containing compound having as a partial structure a structure of the formula (1) used in the reaction.

In this reaction, the sulfur-containing compound having as a partial structure a structure of the formula (1) and the nitrogen-containing compound having two or more nitrogen atoms substituted with a hydroxymethyl group or an alkoxymethyl group can be used singly or in a mixture of two or more compounds, respectively. The proportion of the sulfur-containing compound having as a partial structure a structure of the formula (1) and the nitrogen-containing compound having two or more nitrogen atoms substituted with a hydroxymethyl group or an alkoxymethyl group that are used in this reaction is 4:1 to 1:4, or 3:1 to 1:3, or 3:2 to 2:3, or 4:3 to 3:4, or 1:1 in a molar ratio of the sulfur-containing compound: the nitrogen-containing compound.

This reaction is carried out in an organic solvent such as benzene, toluene, xylene, ethyl lactate, butyl lactate, propylene glycol monomethyl ether, propylene glycol monomethyl ether acetate, and N-methylpyrrolidone, etc. The organic solvent can be used in an amount of for example 1 to 100 times, or 5 to 50 times, or 10 to 30 times based on the whole mass of the sulfur-containing compound, the nitrogen-containing compound and the acid catalyst used in the reaction.

This reaction can be carried out by suitably selecting a condition from a reaction time ranging from 0.1 to 100 hours and a reaction temperature ranging from 20 to 200° C. Preferably, the reaction time is 0.5 to 10 hours and the reaction temperature is 50 to 150° C.

In the reaction of the sulfur-containing compound and the nitrogen-containing compound in the presence of the acid catalyst, it is assumed that dehydration reaction or alcohol-removing reaction may occur between the two or more N—H moieties in the sulfur-containing compound and the hydroxymethyl group or the alkoxymethyl group in the nitrogen-containing compound. Otherwise, it is assumed that the S—H moiety produced by tautomerism of thioamide structure of the sulfur-containing compound may cause dehydration reaction or alcohol-removing reaction with the hydroxymethyl group or the alkoxymethyl group in the nitrogen-containing compound. Further, it is also assumed that the dehydration reaction or alcohol-removing reaction may continuously occur between molecules. And it is assumed that as a result of it, the reaction product with a high molecular weight may be produced.

For example, in case where the reaction is carried out by using thiourea as the sulfur-containing compound and hexamethoxy methyl melamine as the nitrogen-containing compound, it is assumed that the resulting reaction product may have the structure of formula (6) or (7) as the partial structure.

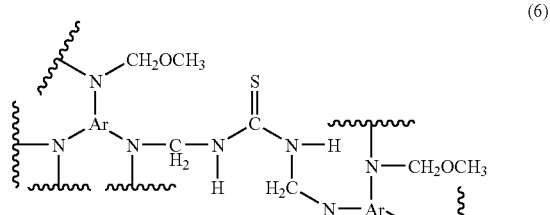

(6)

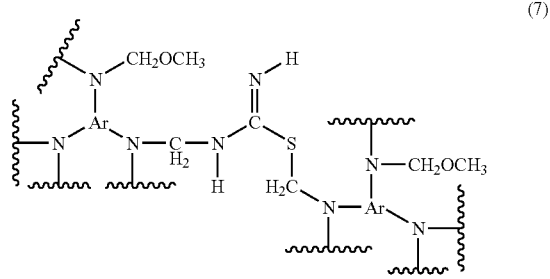

(7)

In the formulae (6) and (7), Ar is a triazine structure.

The reaction product contained in the anti-reflective coating forming composition for lithography according to the present invention has a weight average molecular weight (in terms of standard polystyrene) of for example 500 to 100000, or 1000 to 30000, or 2000 to 10000. When the weight average molecular weight is less than the above-mentioned lower limit, the solubility of the formed anti-reflective coating in the solvent used for the photoresist becomes high, and thus intermixing between the anti-reflective coating and the photoresist often occurs. When the weight average molecular weight is more than the above-mentioned upper limit, the even application on the semiconductor substrate often becomes difficult.

In the anti-reflective coating forming composition for lithography according to the present invention, a reaction product is isolated and the isolated reaction product can be used. A reaction product can be also used in the anti-reflective coating forming composition for lithography according to the present invention as such in a form of a reaction solution containing the reaction product without isolating the reaction product.

The proportion of the reaction product in the solid content of the anti-reflective coating forming composition for lithography according to the present invention is 50 mass % or more, for example 60 to 100 mass %, or 80 to 99.99 mass %, or 90 to 90.9 mass %, or 95 to 99.5 mass %, or 97 to 99 mass %.

The anti-reflective coating forming composition for lithography according to the present invention can also contain a polymer compound.

As the polymer compound, addition polymerized polymers or condensation polymerized polymers such as polyester, polystyrene, polyimide, acryl polymer, methacryl polymer, polyvinyl ether, phenol novolak, naphthol novolak, polyether, polyamide, and polycarbonate, etc. can be used. From viewpoint of light absorption characteristics, it is preferable to use polymer compounds having aromatic ring structure such as benzene ring, naphthalene ring, anthracene ring, triazine ring, quinoline, and quinoxaline, etc.

Such polymer compounds include for example addition polymerized polymers containing as the structural unit addition polymerizable monomers such as benzyl acrylate, benzyl methacrylate, phenyl acrylate, naphthyl acrylate, anthryl methacrylate, anthryl methylmethacrylate, styrene, hydroxy styrene, benzyl vinyl ether, and N-phenyl maleimide, etc., or condensation polymerized polymers such as phenol novolak, and naphthol novolak, etc.

In addition, as the polymer compound, the polymer compound having no aromatic ring structure can be used. Such polymer compound includes for example addition polymerized polymers containing as the structural unit only addition polymerizable monomers having no aromatic ring structure, such as alkyl acrylate, alkyl methacrylate, vinyl ether, alkyl vinyl ether, acrylonitrile, maleimide, N-alkyl maleimide, and maleic anhydride, etc.

When the addition polymerized polymer is used as the polymer compound, the polymer compound may be a simple polymer or copolymer. For the production of the addition polymerized polymer, addition polymerizable monomers are used. The addition polymerizable monomers include acrylic acid, methacrylic acid, acrylate compounds, methacrylate compounds, acryl amide compounds, methacryl amide compounds, vinyl compounds, styrene compounds, maleimide compounds, maleic anhydride, and acrylonitrile, etc.

The acrylate compounds include methyl acrylate, ethyl acrylate, n-hexyl acrylate, isopropyl acrylate, cyclohexyl acrylate, benzyl acrylate, phenyl acrylate, anthryl methyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, terahydrofurfuryl acrylate, 2-methyl-adamantyl acrylate, 5-acryloyloxy-6-hydroxynorbornene-2-carboxylic6-lactone, 3-acryloxypropyltriethoxy silane, and glycidyl acrylate, etc.

The methacrylate compounds include methyl methacrylate, ethyl methacrylate, n-hexyl methacrylate, isopropyl methacrylate, cyclohexyl methacrylate, benzyl methacrylate, phenyl methacrylate, anthryl methyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, terahydrofurfuryl methacrylate, 2-methyl-adamantyl methacrylate, 5-methacryloyloxy-6-hydroxynorbornene-2-carboxylic-6-lactone, 3-methacryloxypropyltriethoxy silane, glycidyl methacrylate, 2-phenylethyl methacrylate, hydroxyphenyl methacrylate, and bromophenyl methacrylate, etc.

The acrylamide compounds include acrylamide, N-methyl acrylamide, N-ethyl acrylamide, N-benzyl acrylamide, N-phenyl acrylamide, N,N-dimethyl acrylamide, and N-anthryl acrylamide, etc.

The methacrylamide compounds include methacrylamide, N-methyl methacrylamide, N-ethyl methacrylamide, N-benzyl methacrylamide, N-phenyl methacrylamide, N,N-dimethyl methacrylamide, and N-anthryl methacrylamide, etc.

The vinyl compounds include vinyl alcohol, 2-hydroxyethyl vinyl ether, methyl vinyl ether, ethyl vinyl ether, benzyl vinyl ether, vinyl acetate, vinyl trimethoxy silane, 2-chloroethyl vinyl ether, 2-methoxyethyl vinyl ether, vinyl naphthalene, and vinyl anthracene, etc.

The styrene compounds include styrene, hydroxy styrene, chloro styrene, bromo styrene, methoxy styrene, cyano styrene, and acetyl styrene, etc.

The maleimide compounds include maleimide, N-methyl maleimide, N-phenyl maleimide, N-cyclohexyl maleimide, N-benzyl maleimide, and N-hydroxyethyl maleimide, etc.

The polymer compound used for the anti-reflective coating forming composition for lithography according to the present invention has a weight average molecular weight (in terms of standard polystyrene) of for example 1000 to 1000000, or 3000 to 300000, or for example 5000 to 200000, or 10000 to 100000.

When the polymer compound is contained in the anti-reflective coating forming composition for lithography according to the present invention, the contained amount is for example 0.1 to 40 mass %, or 1 to 20 mass %, or 3 to 19 mass % in the solid content.

The anti-reflective coating forming composition for lithography according to the present invention can contain also a photoacid generator.

The photoacid generator can adjust the acidity of the anti-reflective coating as it generates an acid on the exposure of photoresists. This is used as a measure for conforming the acidity of the anti-reflective coating to that of the photoresist applied thereon. In addition, the adjustment of the acidity of the anti-reflective coating makes possible to adjust the pattern shape of the photoresist formed thereon.

The photoacid generator includes onium salt compounds, sulfoneimide compounds, and disulfonyl diazomethane compounds, etc.

The onium salt compounds include iodonium salt compounds such as diphenyl iodonium hexafluoro phosphate, diphenyl iodonium trifluoromethane sulfonate, diphenyl iodonium nonafluoro-n-butane sulfonate, diphenyl iodonium perfluoro-n-octane sulfonate, diphenyl iodonium camphor sulfonate, bis(4-tert-butylphenyl) iodonium camphor sulfonate and bis(4-tert-butylphenyl) iodonium trifluoro methane sulfonate, etc., sulfonium salt compounds such as triphenyl sulfonium hexafluoro antimonate, triphenylsulfonium nonafluoro-n-butane sulfonate, triphenyl sulfonium camphor sulfonate and triphenyl sulfonium trifluoro methane sulfonate, etc.

The sulfoneimide compounds include for example N-(trifluoromethanesulfonyloxy) succinimide, N-(nonafluoro-n-butanesulfonyloxy) succinimide, N-(camphorsulfonyloxy) succinimide and N-(trifluoromethanesulfonyloxy) naphthalimide, etc.

The disulfonyl diazomethane compounds include for example bis(trifluoromethylsulfonyl) diazomethane, bis(cyclohexylsulfonyl) diazomethane, bis(phenylsulfonyl) diazomethane, bis(p-toluenesulfonyl) diazomethane, bis(2,4-dimethylbenzenesulfonyl) diazomethane, and methylsulfonyl-p-toluenesulfonyl diazomethane, etc.

The photoacid generator can be used singly or in a combination of two or more.

When the photoacid generator is contained in the anti-reflective coating forming composition for lithography according to the present invention, the contained amount thereof is for example 0.01 to 5 mass %, or 0.1 to 3 mass %, or 0.5 to 2 mass % in the solid content.

The anti-reflective coating forming composition for lithography according to the present invention can contain surfactants, rheology controlling agents and adhesive auxiliary agents, etc., if desired. The surfactants are effective for inhibiting occurrence of pinholes or striation, etc. The rheology controlling agents are effective for improving the fluidity of the anti-reflective coating forming composition, particularly for improving the filling property of the anti-reflective coating forming composition inside holes in the baking step. The adhesive auxiliary agents are effective for improving the adhesiveness between the semiconductor substrate or photoresist and the anti-reflective coating, particularly for preventing separation of the photoresist in development.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., fluorine based surfactants, e.g., trade name: EFTOP EF301, EF303, EF352 (manufactured by Jemco Inc.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name; ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be used singly or in combination of two or more. When the surfactant is contained in the anti-reflective coating forming composition according to the present invention, the contained amount is 0.0001 to 5 mass % or 0.001 to 2 mass %, or 0.01 to 1 mass % in the solid content.

The solvent used in the anti-reflective coating forming composition according to the present invention is any solvent that can dissolve the solid content. Such solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents are used singly or in combination of two or more. Further, high boiling solvents such as propylene glycol monobutyl ether or propylene glycol monobutyl ether acetate, etc. may be mixed and used.

Hereinafter, the utilization of the anti-reflective coating forming composition for lithography according to the present invention is described.

The anti-reflective coating forming composition of the present invention is applied on a semiconductor substrate (for example, silicon wafer substrate, silicon/silicon dioxide coat substrate, silicon nitride substrate, glass substrate, and ITO substrate, etc.) by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably the baking temperature is 130 to 250° C. and the baking time is 0.5 to 3 minutes. The thickness of the anti-reflective coating is for example 0.01 to 3.0 μm, or preferably for example 0.03 to 1.0 μm, or 0.05 to 0.5 μm, or 0.05 to 0.2 μm.

Then, a photoresist layer is formed on the anti-reflective coating. The formation of the photoresist layer can be conducted by well-known process, that is, by application of a photoresist composition solution on the anti-reflective coating and baking.

The photoresist to be coated and formed on the anti-reflective coating of the present invention is not specifically limited so long as it is sensitive to the light used in exposure, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern.

The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. As the developer, 2.38 mass % tetramethyl ammonium hydroxide aqueous solution that is widely used can be used. Further, surfactants can be added in these developers. The condition of development is suitably selected from a temperature of 5 to 50° C. and a time of 10 to 300 seconds.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane, perfluorocyclobutane ($C_4F_8$), perfluoropropane ($C_3F_6$), trifluoromethane, carbon monoxide, argon, oxygen, nitrogen, sulfur hexafluoride, difluoromethane, nitrogen trifluoride and chlorine trifluoride, etc.

Before forming the anti-reflective coating from the anti-reflective coating forming composition for lithography according to the present invention on a semiconductor substrate, a flattening coating or a gap-fill material layer may be formed. In case where semiconductor substrates having large steps or holes are used, it is preferable that the flattening coating or the gap-fill material layer is formed.

The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating from the anti-reflective coating forming composition for lithography according to the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition of the present invention can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

After 10.0 g of hexamethoxy methyl melamine and 1.1 g of thiocyanuric acid were dissolved in 122.0 g of ethyl lactate, 0.2 g of p-toluene sulfonic acid was added and reacted at 100° C. for 3 hours to obtain a solution containing a reaction product. GPC analysis showed that weight average molecular weight of the obtained reaction product was 9000 in terms of standard polystyrene.

Synthetic Example 2

After 10.0 g of hexamethoxy methyl melamine and 2.5 g of thiocyanuric acid were dissolved in 137.5 g of ethyl lactate, 0.3 g of p-toluene sulfonic acid was added and reacted at 100° C. for 3 hours to obtain a solution containing a reaction product. GPC analysis showed that weight average molecular weight of the obtained reaction product was 7900 in terms of standard polystyrene.

Synthetic Example 3

After 10.0 g of hexamethoxy methyl melamine and 2.5 g of dithiouracil were dissolved in 137.5 g of ethyl lactate, 0.3 g of p-toluene sulfonic acid was added and reacted at 100° C. for 3 hours to obtain a solution containing a reaction product. GPC analysis showed that weight average molecular weight of the obtained reaction product was 2100 in terms of standard polystyrene.

Synthetic Example 4

After 10.0 g of hexamethoxy methyl melamine and 2.5 g of thiourea were dissolved in 62.3 g of ethyl lactate, 0.3 g of p-toluene sulfonic acid was added and reacted at 80° C. for 1 hour to obtain a solution containing a reaction product. GPC analysis showed that weight average molecular weight of the obtained reaction product was 5100 in terms of standard polystyrene.

Synthetic Example 5

After 9.0 g of hexamethoxy methyl melamine and 3.9 g of thiourea were dissolved in 63.6 g of ethyl lactate, 0.2 g of p-toluene sulfonic acid was added and reacted at 80° C. for 1 hour to obtain a solution containing a reaction product. GPC analysis showed that weight average molecular weight of the obtained reaction product was 2000 in terms of standard polystyrene.

Synthetic Example 6

After 7.0 g of hexamethoxy methyl melamine and 4.7 g of thiourea were dissolved in 57.7 g of ethyl lactate, 0.2 g of p-toluene sulfonic acid was added and reacted at 80° C. for 1 hour to obtain a solution containing a reaction product. GPC analysis showed that weight average molecular weight of the obtained reaction product was 2700 in terms of standard polystyrene.

Synthetic Example 7

After 6.0 g of hexamethoxy methyl melamine and 6.0 g of thiourea were dissolved in 59.4 g of ethyl lactate, 0.2 g of p-toluene sulfonic acid was added and reacted at 80° C. for 1 hour to obtain a solution containing a reaction product. GPC analysis showed that weight average molecular weight of the obtained reaction product was 1800 in terms of standard polystyrene.

Synthetic Example 8

After 4.0 g of hexamethoxy methyl melamine and 1.0 g of ethylthiourea were dissolved in 54.5 g of ethyl lactate, 0.1 g of p-toluene sulfonic acid was added and reacted at 120° C. for 1 hour to obtain a solution containing a reaction product. GPC analysis showed that weight average molecular weight of the obtained reaction product was 5500 in terms of standard polystyrene.

Synthetic Example 9

After 4.0 g of hexamethoxy methyl melamine and 1.7 g of ethylthiourea were dissolved in 62.3 g of ethyl lactate, 0.1 g of p-toluene sulfonic acid was added and reacted at 120° C. for 1 hour to obtain a solution containing a reaction product. GPC analysis showed that weight average molecular weight of the obtained reaction product was 46000 in terms of standard polystyrene.

Synthetic Example 10

After 8.5 g of hexamethoxy methyl melamine and 2.1 g of acetylthiourea were dissolved in 52.9 g of ethyl lactate, 0.2 g of 5-sulfosalicylic acid was added and reacted at 80° C. for 3 hours to obtain a solution containing a reaction product. GPC analysis showed that weight average molecular weight of the obtained reaction product was 920 in terms of standard polystyrene.

Synthetic Example 11

After 7.5 g of hexamethoxy methyl melamine and 3.2 g of acetylthiourea were dissolved in 53.4 g of ethyl lactate, 0.2 g of 5-sulfosalicylic acid was added and reacted at 80° C. for 3 hours to obtain a solution containing a reaction product. GPC analysis showed that weight average molecular weight of the obtained reaction product was 870 in terms of standard polystyrene.

Synthetic Example 12

After 6.3 g of hexamethoxy methyl melamine and 4.2 g of acetylthiourea were dissolved in 52.3 g of ethyl lactate, 0.2 g of 5-sulfosalicylic acid was added and reacted at 80° C. for 3 hours to obtain a solution containing a reaction product. GPC analysis showed that weight average molecular weight of the obtained reaction product was 800 in terms of standard polystyrene.

Synthetic Example 13

After 5.2 g of hexamethoxy methyl melamine and 5.2 g of acetylthiourea were dissolved in 51.8 g of ethyl lactate, 0.2 g of 5-sulfosalicylic acid was added and reacted at 80° C. for 3 hours to obtain a solution containing a reaction product. GPC analysis showed that weight average molecular weight of the obtained reaction product was 660 in terms of standard polystyrene.

Synthetic Example 14

According to the method described in U.S. Pat. No. 6,323, 310, after 40.0 g of hexamethoxy methyl melamine was dissolved in 300.3 g of ethyl lactate, 1.5 g of p-toluene sulfonic acid was added and reacted at 120° C. for 24 hours to obtain a solution containing a compound that hexamethoxy methyl melamine is polymerized.

Synthetic Example 15

In 20.0 g of the solution obtained in Synthetic Example 14, 4.2 g of ethyl lactate and 0.9 g of acetylthiourea were added and reacted at 80° C. for 3 hours to obtain a solution containing a reaction product. GPC analysis showed that weight average molecular weight of the obtained reaction product was 18000 in terms of standard polystyrene.

Synthetic Example 16

In 20.0 g of the solution obtained in Synthetic Example 14, 7.1 g of ethyl lactate and 1.5 g of acetylthiourea were added and reacted at 80° C. for 3 hours to obtain a solution containing a reaction product. GPC analysis showed that weight average molecular weight of the obtained reaction product was 15000 in terms of standard polystyrene.

Synthetic Example 17

In 20.0 g of the solution obtained in Synthetic Example 14, 11.1 g of ethyl lactate and 2.3 g of acetylthiourea were added and reacted at 80° C. for 3 hours to obtain a solution containing a reaction product. GPC analysis showed that weight average molecular weight of the obtained reaction product was 13000 in terms of standard polystyrene.

Synthetic Example 18

In 20.0 g of the solution obtained in Synthetic Example 14, 16.6 g of ethyl lactate and 3.4 g of acetylthiourea were added and reacted at 80° C. for 3 hours to obtain a solution containing a reaction product. GPC analysis showed that weight average molecular weight of the obtained reaction product was 10000 in terms of standard polystyrene.

Synthetic Example 19

After 10.0 g of hexamethoxy methyl melamine and 2.5 g of 1,3-dimethylthiourea were dissolved in 62.3 g of ethyl lactate, 0.3 g of p-toluene sulfonic acid was added and reacted at 80° C. for 24 hours to obtain a solution containing a reaction product. GPC analysis showed that weight average molecular weight of the obtained reaction product was 1700 in terms of standard polystyrene.

Synthetic Example 20

After 7.5 g of hexamethoxy methyl melamine and 5.0 g of 1,3-dimethylthiourea were dissolved in 62.3 g of ethyl lactate, 0.3 g of p-toluene sulfonic acid was added and reacted at 80° C. for 24 hours to obtain a solution containing a reaction product. GPC analysis showed that weight average molecular weight of the obtained reaction product was 1900 in terms of standard polystyrene.

Synthetic Example 21

After 4.0 g of hexamethoxy methyl melamine and 4.0 g of 1,3-dimethylthiourea were dissolved in 39.8 g of ethyl lactate, 0.2 g of p-toluene sulfonic acid was added and reacted at 80° C. for 24 hours to obtain a solution containing a reaction product. GPC analysis showed that weight average molecular weight of the obtained reaction product was 3700 in terms of standard polystyrene.

Synthetic Example 22

After 10.0 g of hexamethoxy methyl melamine and 2.5 g of benzoylthiourea were dissolved in 62.3 g of ethyl lactate, 0.3 g of p-toluene sulfonic acid was added and reacted at 80° C. for 3 hours to obtain a solution containing a reaction product. GPC analysis showed that weight average molecular weight of the obtained reaction product was 810 in terms of standard polystyrene.

Synthetic Example 23

After 7.5 g of hexamethoxy methyl melamine and 5.0 g of benzoylthiourea were dissolved in 62.3 g of ethyl lactate, 0.3 g of p-toluene sulfonic acid was added and reacted at 80° C. for 3 hours to obtain a solution containing a reaction product. GPC analysis showed that weight average molecular weight of the obtained reaction product was 670 in terms of standard polystyrene.

Synthetic Example 24

After 10.0 g of hexamethoxy methyl melamine, 10.0 g of benzoguanamine and 5.0 g of thiourea were dissolved in 124.5 g of ethyl lactate, 0.5 g of p-toluene sulfonic acid was added and reacted at 80° C. for 1 hour to obtain a solution containing a reaction product. GPC analysis showed that weight average molecular weight of the obtained reaction product was 9100 in terms of standard polystyrene.

Example 1

In 50 g of the solution containing the reaction product obtained in Synthetic Example 1, 20.8 g of ethyl lactate was added. Then, the resulting mixture was filtered through a micro filter made of polyethylene having a pore diameter of 0.10 µm and further a micro filter made of polyethylene having a pore diameter of 0.05 µm to prepare an anti-reflective coating forming composition solution for lithography.

Examples 2 and 3

In 50 g of each solution containing the reaction product obtained in Synthetic Examples 2 and 3, 20.8 g of ethyl lactate was added. Then, the resulting mixtures were filtered similarly to the procedure of Example 1 to prepare anti-reflective coating forming composition solutions for lithography.

Examples 4 to 7

In 50 g of each solution containing the reaction product obtained in Synthetic Examples 4 to 7, 91.7 g of ethyl lactate was added. Then, the resulting mixtures were filtered similarly to the procedure of Example 1 to prepare anti-reflective coating forming composition solutions for lithography.

Examples 8 and 9

In 50 g of each solution containing the reaction product obtained in Synthetic Examples 8 and 9, 20.8 g of ethyl lactate was added. Then, the resulting mixtures were filtered similarly to the procedure of Example 1 to prepare anti-reflective coating forming composition solutions for lithography.

Examples 10 to 13

In 50 g of each solution containing the reaction product obtained in Synthetic Examples 10 to 13, 20.8 g of ethyl lactate was added. Then, the resulting mixtures were filtered similarly to the procedure of Example 1 to prepare anti-reflective coating forming composition solutions for lithography.

Examples 14 to 23

In 50 g of each solution containing the reaction product obtained in Synthetic Examples 14 to 23, 91.7 g of ethyl lactate was added. Then, the resulting mixtures were filtered similarly to the procedure of Example 1 to prepare anti-reflective coating forming composition solutions for lithography.

Dissolution Test in Solvent

The anti-reflective coating forming composition solutions obtained in Examples 1 to 23 were coated on silicon wafer substrate substrates by means of a spinner, respectively. The coated silicon wafer substrates were baked at 205° C. for 1 minute on a hot plate to form anti-reflective coatings (film thickness 0.078 μm). The anti-reflective coatings were dipped in ethyl lactate and propylene glycol monomethyl ether being solvents used for photoresists, and as a result it was confirmed that the resulting anti-reflective coatings were insoluble in these solvents. Further, the anti-reflective coatings were dipped in alkaline developers for developing photoresist, thereby it was confirmed that the anti-reflective coatings were insoluble in the alkaline developers.

Test of Optical Parameter

The anti-reflective coating forming composition solutions prepared in Examples 1 to 23 were coated on silicon wafer substrates by means of a spinner. The coated silicon wafer substrates were baked at 205° C. for 1 minute on a hot plate to form anti-reflective coatings (film thickness 0.2 μm). On the anti-reflective coatings, refractive index (n) and attenuation coefficient (k) at a wavelength of 248 nm were measured with a spectroscopic ellipsometer (manufactured by J. A. Woolam Co., Inc., VUV-VASE VU-302). The results are shown in Table 1.

Measurement of Dry Etching Rate

According to the procedure similar to the above, the anti-reflective coatings (film thickness 0.2 μm) were formed on silicon wafers from the solutions prepared in Examples 1 to 23. Then, dry etching rate on these anti-reflective coatings was measured with RIE system ES401 manufactured by Nippon Scientific Co., Ltd. under the condition in which $CF_4$ was used as dry etching gas.

Similarly, a photoresist solution (trade name: PAR710 manufactured by Sumitomo Chemical Co., Ltd.) was coated on a silicon wafer substrate by means of a spinner. The coated silicon wafer substrate was baked at 95° C. for 1 minute on a hot plate to form a photoresist layer. Then, dry etching rate was measured with RIE system ES401 manufactured by Nippon Scientific Co., Ltd. under the condition in which $CF_4$ was used as dry etching gas. The dry etching rate was compared between the anti-reflective coatings formed from Examples 1 to 23 and the photoresist The results are shown in Table 1. In Table 1, selection ratio means the etching rate of each anti-reflective coating formed from each Example in case where the dry etching rate of the photoresist PAR710 is regarded as 1.00.

TABLE 1

|  | n | k | Selection Ratio |
| --- | --- | --- | --- |
| Example 1 | 2.02 | 0.35 |  |
| Example 2 | 1.86 | 0.39 | 2.67 |
| Example 3 | 1.94 | 0.38 | 2.28 |
| Example 4 | 2.07 | 0.43 | 2.54 |
| Example 5 | 2.04 | 0.48 | 2.64 |
| Example 6 | 2.06 | 0.55 | 2.69 |

TABLE 1-continued

|  | n | k | Selection Ratio |
| --- | --- | --- | --- |
| Example 7 | 2.05 | 0.60 | 2.77 |
| Example 8 | 2.03 | 0.29 | 2.25 |
| Example 9 | 2.01 | 0.35 | 2.28 |
| Example 10 | 2.00 | 0.21 |  |
| Example 11 | 1.99 | 0.23 |  |
| Example 12 | 1.99 | 0.26 |  |
| Example 13 | 1.99 | 0.28 |  |
| Example 14 | 2.13 | 0.32 |  |
| Example 15 | 2.12 | 0.31 |  |
| Example 16 | 2.12 | 0.33 |  |
| Example 17 | 2.13 | 0.36 |  |
| Example 18 | 2.07 | 0.30 | 2.46 |
| Example 19 | 2.09 | 0.32 | 2.34 |
| Example 20 | 2.10 | 0.29 | 2.47 |
| Example 21 | 2.08 | 0.32 | 2.18 |
| Example 22 | 2.02 | 0.37 | 1.86 |
| Example 23 | 1.92 | 0.47 |  |

From Table 1, it is clear that the anti-reflective coatings prepared from the anti-reflective coating forming compositions of the present invention have a refractive index and attenuation coefficient effective for light of wavelength 248 nm. It is also clear that the anti-reflective coatings have higher dry etching rate compared with photoresists.

The invention claimed is:

1. An anti-reflective coating forming composition for lithography comprising:

a reaction product obtained by reacting a sulfur-containing compound having as a partial structure having a structure of formula (1):

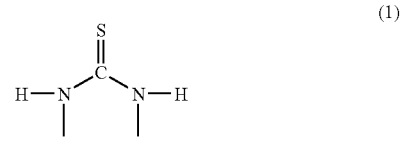

with a nitrogen-containing compound having two or more nitrogen atoms substituted with methoxymethyl in the presence of an acid catalyst; and a solvent, wherein the reaction product has a weight average molecular weight ranging from 500 to 100,000 in terms of standard polystyrene, wherein the reaction product has a partial structure having a structure of formula (6) or formula (7):

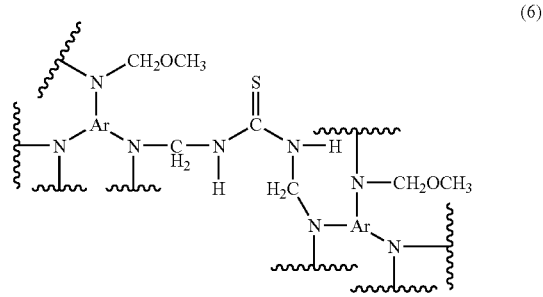

-continued

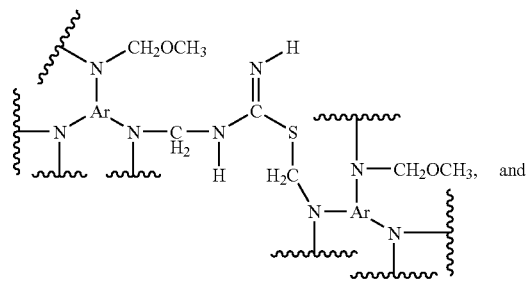

(7)

wherein Ar is a triazine structure.

2. The anti-reflective coating forming composition for lithography according to claim 1, wherein the nitrogen-containing compound is hexamethoxymethyl melamine.

3. The anti-reflective coating forming composition for lithography according to claim 1, wherein the acid catalyst is an aromatic sulfonic acid compound.

4. A method for forming photoresist pattern for use in manufacture of semiconductor device, comprising the steps of:

coating the anti-reflective coating forming composition for lithography according to claim 1 on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light.

* * * * *